US006862136B2

(12) United States Patent
Koren et al.

(10) Patent No.: US 6,862,136 B2
(45) Date of Patent: Mar. 1, 2005

(54) HYBRID OPTICAL TRANSMITTER WITH ELECTROABSORPTION MODULATOR AND SEMICONDUCTOR OPTICAL AMPLIFIER

(75) Inventors: Uziel Koren, Kiryat Tiyon (IL); David Finzi, Haifa (IL); Yonatan Biran, Timrat (IL)

(73) Assignee: Cyoptics Ltd., Yokneam Illit (IL)

( * ) Notice: Subject to any disclaimer, the term of this patent is extended or adjusted under 35 U.S.C. 154(b) by 0 days.

(21) Appl. No.: 10/357,331

(22) Filed: Jan. 30, 2003

(65) Prior Publication Data

US 2004/0032646 A1 Feb. 19, 2004

Related U.S. Application Data

(60) Provisional application No. 60/354,045, filed on Jan. 31, 2002.

(51) Int. Cl.[7] .............................. H01S 3/00; H04B 10/06
(52) U.S. Cl. .................... 359/344; 359/337.4; 398/201
(58) Field of Search ............................. 359/344, 337.4; 372/50; 398/201

(56) References Cited

U.S. PATENT DOCUMENTS

| | | |
|---|---|---|
| 3,649,930 A | 3/1972 | Le Floch |
| 4,503,541 A | 3/1985 | Weller et al. |
| 4,779,279 A | 10/1988 | Brown |
| 4,786,132 A | 11/1988 | Gordon |
| 5,007,062 A | 4/1991 | Chesnoy |
| 5,040,183 A | 8/1991 | Chen et al. |
| 5,077,816 A | 12/1991 | Glomb et al. |
| 5,181,213 A | 1/1993 | Shinokura et al. |
| 5,305,336 A | 4/1994 | Adar et al. |
| 5,586,138 A | 12/1996 | Yokoyama |
| 5,706,301 A | 1/1998 | Legerstrom |
| 5,790,579 A | 8/1998 | Lee et al. |
| 5,870,417 A | 2/1999 | Verdiell et al. |

(List continued on next page.)

FOREIGN PATENT DOCUMENTS

| | | |
|---|---|---|
| EP | 949729 | 10/1999 |
| JP | 7015083 | 1/1995 |
| JP | 7193329 | 7/1995 |
| JP | 7307512 | 11/1995 |
| JP | 8321652 | 12/1996 |
| JP | 410336117 A | * 12/1998 |
| JP | 11145554 | 5/1999 |
| WO | WO 99/39411 | 8/1999 |

OTHER PUBLICATIONS

"3.2 Tb/s (80x40 Gb/s) bi–directional DWDM/ETDM transmission", J.P. Elbers, et al., post–deadline paper PD2–5, ECOC 1999.

"5.5mm long InGaAs monolithic extended cavity laser with an Integrated Bragg–reflector for active mode–locking", P.B. Hansen, et al. IEEE PTL, vol. 4, pp. 215–217, 1992.

"Short pulse generation using multi–segment mode–locked semiconductor lasers", D.J. Derickson, et al., IEEE JQE, vol. 28, pp. 2186–2202, 1992.

(List continued on next page.)

*Primary Examiner*—Mark Hellner
(74) *Attorney, Agent, or Firm*—Ladas & Parry (57) ABSTRACT

An optical radiation amplifier, including an input port which receives the optical radiation and a first semiconductor optical amplifier (SOA), which is coupled to receive the optical radiation from the input port and is adapted to amplify the optical radiation to produce amplified optical radiation in response to a first current injected into the first SOA. The amplifier also includes an electro-absorption modulator (EAM), which is coupled to receive the amplified optical radiation and is adapted to modulate the amplified optical radiation in response to a modulation voltage applied to the EAM so as to produce modulated radiation. There is a second SOA, which is coupled to receive the modulated radiation and is adapted to amplify the modulated radiation in response to a second current injected into the second SOA.

38 Claims, 5 Drawing Sheets

U.S. PATENT DOCUMENTS

| | | | |
|---|---|---|---|
| 5,914,972 A | | 6/1999 | Siala et al. |
| 5,986,790 A | * | 11/1999 | Ota et al. ............... 398/1 |
| 5,991,060 A | * | 11/1999 | Fishman et al. ........... 398/198 |
| 6,084,893 A | | 7/2000 | Choi et al. |
| 6,330,266 B1 | * | 12/2001 | Yamaguchi ............... 372/50 |
| 6,381,066 B1 | | 4/2002 | Korn et al. |
| 6,389,047 B1 | | 5/2002 | Fischer |
| 6,400,864 B1 | | 6/2002 | Lee |
| 6,434,176 B1 | | 8/2002 | Deck |
| 6,472,682 B1 | * | 10/2002 | Kuramoto ............... 257/14 |
| 6,649,938 B1 | | 11/2003 | Bogatov et al. |

OTHER PUBLICATIONS

"Monolithic colliding–pulse mode–locked quantum well lasers", Y.K. Chen, et al., IEEE JQE vol. 28, pp. 2176–2184, 1992.

Narrow line semiconductor laser using fibre grating, D.M. Bird, et al., Elec. Lett. vol. 27, pp. 1116–1117, 1991.

"Packaged hybrid soliton pulse source results and 270 Terabit.km/sec Soliton Transmission", P.A. Morton, et al., IEEE PTL, vol. 7, pp. 111–113, 1995.

Rigole, "114nm Wavelength Tuning Range of a vertical grating assistant codirectional coupler laser with a super structure grating distributed bragg reflector", PTL, 7 1995.

"Semiconductor Photonic Integrated Circuits", by T.L. Koch, et al., in IEEE J Quantum Electronics vol. QE–27, pp. 641–653, 1991.

* cited by examiner

HYBRID OPTICAL TRANSMITTER WITH ELECTROABSORPTION MODULATOR AND SEMICONDUCTOR OPTICAL AMPLIFIER

CROSS REFERENCE TO RELATED APPLICATION

This application claims the benefit of U.S. Provisional Patent Application No. 60/354,045, filed Jan. 31, 2002, which is incorporated herein by reference.

FIELD OF THE INVENTION

The present invention relates generally to signal transmission, and specifically to transmission of optical signals.

BACKGROUND OF THE INVENTION

An optical signal transmitter is typically constructed from a laser followed by a modulator that modulates the coherent radiation emitted by the laser. The laser may be a laser diode (LD), and the modulator may be a semiconductor electro-absorption modulator (EAM). Typically, the LD-EAM combination is required to output a high radiation power and is also required to have a high extinction ratio (ER) and relatively flat frequency response up to the bit rate frequency.

U.S. Pat. No 6,381,066 to Korn, et al., whose disclosure is incorporated herein by reference, describes an integrated semiconductor optical amplifier (SOA) system. The system consists of a single SOA which is mounted on an optical bench, with fiber optics coupling optical radiation into and out of the SOA via isolators. The system is constructed, with a diode that monitors radiation in the system, as a hermetic package.

U.S. Pat. No. 6,400,864 to Lee, whose disclosure is incorporated herein by reference, describes a broadband SOA module. An broadband optical signal is demultiplexed by a demultiplexer into separate wavelengths, and each wavelength is amplified by a respective SOA. The amplified wavelengths are then combined in a multiplexer. The demultiplexer, the SOAs, and the multiplexer are integrated on a single semiconductor substrate.

To achieve a flat frequency response, typical optical transmitters utilize a matched circuit that may include capacitors and that is tuned to the EAM. In order to flatten the frequency response curve the circuit reduces the response of the EAM by a relatively large amount at lower frequencies, thus effectively sacrificing some of the available extinction ratio of the EAM. Other parameters that may adversely affect the output power and signal quality of the LD-EAM combination include the insertion loss (IL) of the modulator, and chirp of the EAM. In LD-EAM transmitters known in the art the output power is limited by the power handling ability of the EAM.

An optical radiation transmitter which outputs a high radiation launch power, with minimal sacrifice in ER, and which has reduced chirp, would thus be advantageous.

SUMMARY OF THE INVENTION

It is an object of some aspects of the present invention to provide a semiconductor optical transmitter.

It is a further object of some aspects of the present invention to provide a hybrid integrated device that acts as the semiconductor optical transmitter.

In preferred embodiments of the present invention, a semiconductor laser transmits coherent radiation via an isolator to a combined semiconductor optical amplifier (SOA) and electro-absorption modulator (EAM) device. The semiconductor laser, the isolator, and the combined SOA-EAM device are implemented as one hybrid integrated module. The combined SOA-EAM device in the module amplifies and modulates the radiation from the semiconductor laser. The output from the hybrid module is coupled to an output fiber optic, with higher launch power and better signal quality, as measured by the frequency response, extinction ratio, and chirp, compared to systems known in the art.

The combined SOA-EAM device is produced as a monolithic device by forming a first SOA section, an EAM section, and a second SOA section in series in a single waveguide within a semiconductor. The EAM section is coupled to an external driver using a non-capacitative matching circuit, and, most preferably, the second SOA section is operated in a partially saturated state. Forming the SOAs as two separate sections provides a number of advantages compared to using a single SOA at the input of the EAM:

Output launch power of the module can be increased significantly, while the frequency response of the module remains flat, without compromising on chirp or reducing extinction ratio;

Coupling loss between the SOA-EAM device and the semiconductor laser is compensated for, and coupling between the two components is more tolerant to misalignment;

Total drive current to the SOAs is reduced;

Heat and power dissipation of the device is improved.

In some preferred embodiments of the present invention, the combined SOA-EAM device comprises an integral power detector that may be used to monitor power generated by the hybrid module. The detector may be used as an input to a first feedback loop which regulates the power generated by the module. The feedback loop may be used to control the amplifications of the SOAs and preferably, to also control the level output by the semiconductor laser. Alternatively, a second feedback loop is provided for controlling the level output by the laser. The second loop preferably uses a detector which monitors power output through a back facet of the laser.

The hybrid module is most preferably temperature controlled by being mounted on a thermal transfer device such as a thermoelectric cooler. The hybrid module includes sensors such as one or more thermistors, the outputs of which are used as control inputs to a feedback loop for controlling the temperature of the device.

In some preferred embodiments of the present invention, the hybrid module comprises a second optical isolator that is positioned between an exit facet of the combined SOA-EAM device and the fiber optic. The additional isolator minimizes optical return loss that may interfere with the performance of an external optical network.

There is therefore provided, according to a preferred embodiment of the present invention, an optical radiation amplifier, including;

an input port which receives the optical radiation;

a first semiconductor optical amplifier (SOA), which is coupled to receive the optical radiation from the input port and is adapted to amplify the optical radiation to produce amplified optical radiation in response to a first current injected into the first SOA;

an electro-absorption modulator (EAM), which is coupled to receive the amplified optical radiation and is adapted to modulate the amplified optical radiation in response to a modulation voltage applied to the EAM so as to produce modulated radiation; and a second SOA, which is coupled to receive the modulated radiation and is adapted to amplify the modulated radiation in response to a second current injected into the second SOA.

The amplifier preferably includes a waveguide, wherein the first SOA, the EAM, and the second SOA are formed as respective sections of the waveguide; and preferably also includes a substrate wherein the first SOA, the EAM, the second SOA, and the waveguide are formed as a monolithic unit. The monolithic unit may include a power monitor which is adapted to measure a level of radiation output from the second SOA; and the unit preferably has a front facet and a back facet which are intersected respectively by the waveguide at a first and a second intersection, wherein the input port includes the first intersection, and wherein at least one of the intersections is non-normal to its respective facet.

The second current preferably operates the second SOA in a partially saturated state, and most preferably, the partially saturated state consists of a partial saturation of approximately 1 dB.

The amplifier preferably includes an impedance matching circuit connected to the EAM so that a frequency response of the amplifier is substantially flat, and the impedance matching circuit is most preferably non-capacitative.

There is further provided, according to a preferred embodiment of the present invention, an optical transmitter, including:

a substrate;

a semiconductor laser which is adapted to output coherent radiation;

an isolator which is coupled to receive the coherent radiation and to transport the received radiation in a preferred direction while inhibiting transmission of the radiation in a direction opposite the preferred direction;

a semiconductor optical amplifier (SOA) which is coupled to receive the coherent radiation from the isolator and is adapted to amplify the coherent radiation so as to generate amplified radiation; and an electro-absorption modulator (EAM), which is coupled to receive the amplified radiation and is adapted to modulate the amplified radiation in response to a modulation voltage applied to the EAM so as to produce modulated radiation, wherein the semiconductor laser, the isolator, the SOA, and the EAM are mounted on the substrate as a single hybrid integrated module that emits the modulated radiation.

The transmitter preferably includes a subsequent SOA which is coupled to receive the modulated radiation from the EAM and is adapted to amplify the modulated radiation so as to generate modulated amplified radiation, wherein the subsequent SOA is mounted on the substrate, and wherein the single hybrid integrated module includes the subsequent SOA. Most preferably, the transmitter includes:

an output port; and a subsequent isolator which is coupled to receive the modulated amplified radiation and which is adapted to transport the modulated amplified radiation to the output port while inhibiting reflection of radiation from the output port.

Further preferably, the transmitter includes a power monitor which is adapted to measure a level of the modulated amplified radiation, wherein the single hybrid integrated module includes the power monitor, and wherein an output of the power monitor is an input to a feedback loop controlling current injected into the SOA and the subsequent SOA. Alternatively or additionally, the current is injected into the semiconductor laser.

Preferably, the semiconductor laser includes a back facet through which a portion of the coherent radiation is output, and has a radiation detector which is adapted to monitor the portion of the coherent radiation, wherein the single hybrid integrated module includes the radiation detector, and wherein an output of the detector is an input to a feedback loop controlling current injected into the semiconductor laser.

Further preferably, the single hybrid integrated module includes at least one temperature sensor that provides an input to feedback circuitry, wherein the feedback circuitry controls thermal transfer to and from the module in response to the input.

There is further provided, according to a preferred embodiment of the present invention, an optical radiation amplifier, including:

an electro-absorption modulator (EAM), which is coupled to receive the optical radiation and is adapted to modulate the optical radiation in response to a modulation voltage applied to the EAM so as to produce modulated radiation; and a semiconductor optical amplifier (SOA), which is coupled to receive the modulated radiation and is adapted to amplify the modulated radiation in response to a current injected into the SOA, wherein the current operates the SOA at a partial saturation of approximately 1 dB.

The optical radiation amplifier preferably includes an impedance matching circuit connected to the EAM so that a frequency response of the optical radiation amplifier is substantially flat, and most preferably, the impedance matching circuit is non-capacitative.

There is further provided, according to a preferred embodiment of the present invention, a method for amplifying optical radiation, including: receiving the optical radiation in a first semiconductor optical amplifier (SOA);

amplifying the optical radiation in the first SOA to produce amplified optical radiation in response to a first current injected into the first SOA;

receiving the amplified optical radiation in an electro-absorption modulator (EAM);

modulating the amplified optical -radiation in the EAM in response to a modulation voltage applied to the EAM so as to produce modulated radiation;

receiving the modulated radiation in a second SOA; and amplifying the modulated radiation in the second SOA in response to a second current injected into the second SOA.

The method preferably also includes forming the first SOA, the EAM, and the second SOA as respective sections of a waveguide, and, most preferably, forming the first SOA, the EAM, the second SOA, and the waveguide on a substrate as a monolithic unit.

The monolithic unit preferably includes a power monitor which is adapted to measure a level of radiation output from the second SOA.

The monolithic unit preferably includes a front facet and a back facet which are intersected respectively by the waveguide at a first and a second intersection, and wherein at least one of the intersections is non-normal to its respective facet.

Preferably, the second current operates the second SOA in a partially saturated state, and, most preferably, the partially saturated state consists of a partial saturation of approximately 1 dB.

The method preferably includes connecting an impedance matching circuit to the EAM so that a frequency response of the amplifier is substantially flat, and the impedance matching circuit is most preferably non-capacitative.

There is further provided, according to a preferred embodiment of the present invention, a method for transmitting radiation, including:

outputting coherent radiation from a semiconductor laser;

receiving the coherent radiation in an isolator which transports the received radiation in a preferred direction while inhibiting transmission of the radiation in a direction opposite the preferred direction;

receiving the coherent radiation from the isolator in a semiconductor optical amplifier (SOA), and amplifying the coherent radiation in the SOA so as to generate amplified radiation;

receiving the amplified radiation in an electro-absorption modulator (EAM), and modulating the amplified radiation in the EAM in response to a modulation voltage applied to the EAM so as to produce modulated radiation; and mounting the semiconductor laser, the isolator, the SOA, and the EAM on a substrate as a single hybrid integrated module that emits the modulated radiation.

The method preferably includes:

receiving the modulated radiation from the EAM in a subsequent SOA;

amplifying the modulated radiation in the subsequent SOA so as to generate modulated amplified radiation; and mounting the subsequent SOA on the substrate so that the single hybrid integrated module includes the subsequent SOA.

The method further preferably includes:

receiving the modulated amplified radiation in a subsequent isolator; and transporting the modulated amplified radiation to an output port of the module while inhibiting reflection of radiation from the output port in the subsequent isolator.

The single hybrid integrated module preferably includes a power monitor which is adapted to measure a level of the modulated amplified radiation, wherein an output of the power monitor is an input to a feedback loop controlling current injected into the SOA and the subsequent SOA. Alternatively or additionally, the current is injected into the semiconductor laser.

Preferably, the semiconductor laser includes a back facet through which a portion of the coherent radiation is output, the single hybrid integrated module includes a radiation detector which is adapted to monitor the portion of the coherent radiation, and an output of the detector is an input to a feedback loop controlling current injected into the semiconductor laser.

Further preferably, the single hybrid integrated module includes at least one temperature sensor that provides an input to feedback circuitry, wherein the feedback circuitry controls thermal transfer to and from the module in response to the input.

There is further provided, according to a preferred embodiment of the present invention, a method for amplifying optical radiation, including:

receiving the optical radiation in an electro-absorption modulator (EAM), which is adapted to modulate the optical radiation in response to a modulation voltage applied to the EAM so as to produce modulated radiation;

receiving the modulated radiation in a semiconductor optical amplifier (SOA), which is adapted to amplify the modulated radiation in response to a current injected into the SOA; and injecting the current into the SOA so as to operate the SOA at a partial saturation of approximately 1 dB.

The method preferably includes connecting an impedance matching circuit to the EAM so that a frequency response of the amplifier is substantially flat, and, most preferably, the impedance matching circuit is non-capacitative.

The present invention will be more fully understood from the following detailed description of the preferred embodiments thereof, taken together with the drawings, a brief description of which follows.

DETAILED DESCRIPTION OF PREFERRED EMBODIMENTS

Figure 1:
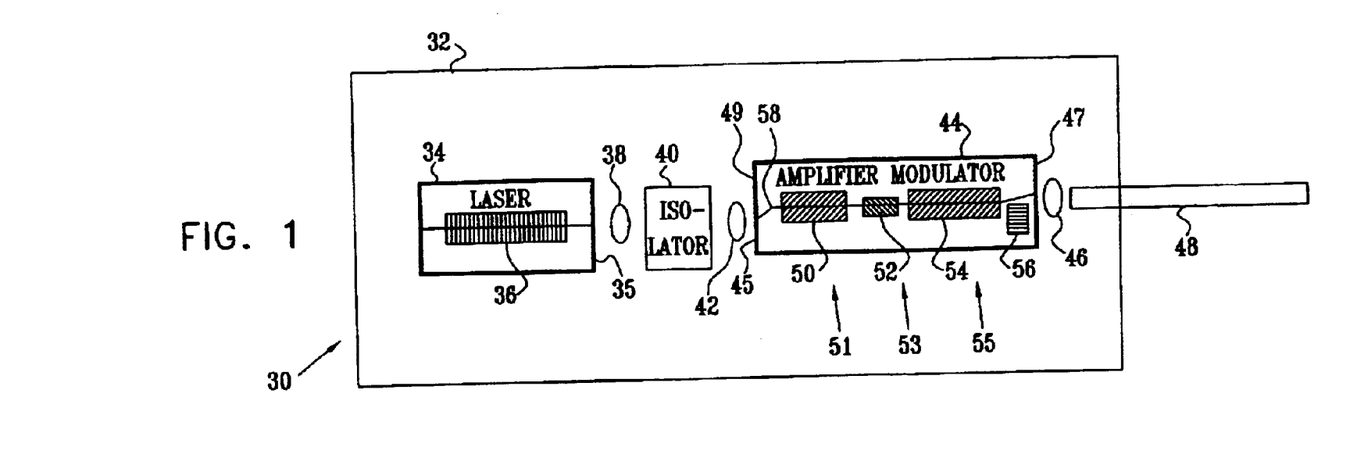
FIG. 1 is a schematic top view of a hybrid transmitter module, according to a preferred embodiment of the present invention.
Figure 2:
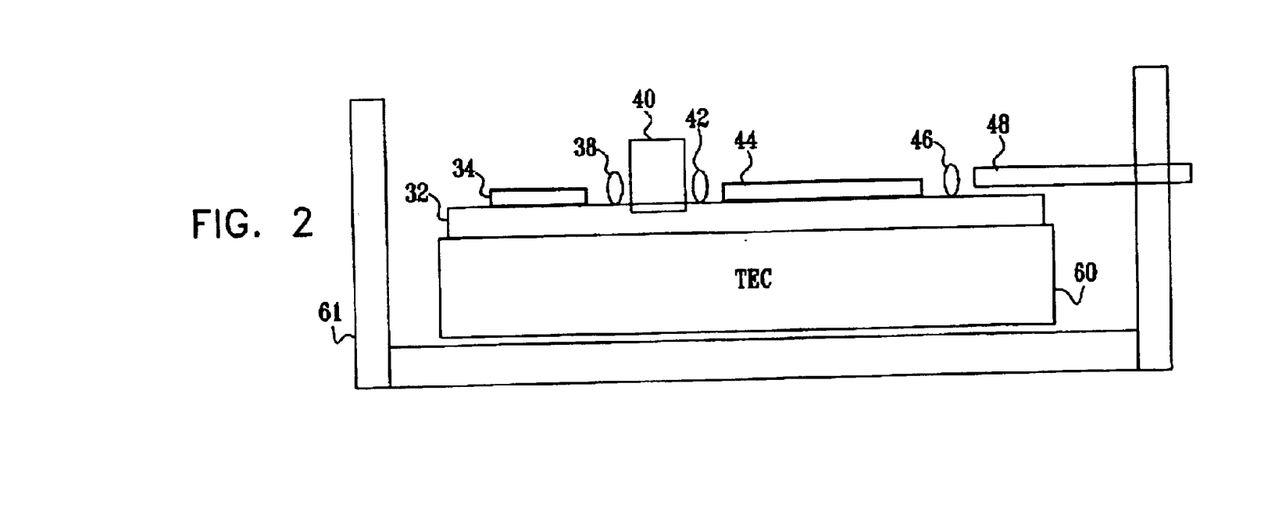
FIG. 2 is a schematic side view of the module of FIG. 1, according to a preferred embodiment of the present invention.

Reference is now made to FIG. 1, which is a schematic top view of a hybrid transmitter module 30, and to FIG. 2, which is a schematic side view of the module, according to a preferred embodiment of the present invention. Module 30 comprises a semiconductor laser diode (LD) 34 having a control electrode 36. Laser diode 34 may be substantially any laser diode known in the art, such as a Fabry-Perot or a distributed feedback (DFB) laser or a tunable laser such as a distributed Bragg reflector laser (DBR). LD 34 is mounted on an inert substrate 32, which acts as a ground for the laser diode. LD 34 radiates its output, typically as linearly polarized radiation, through a front facet 35.

The output from facet 35 is focussed by lenses 38 and 42 onto a front facet 45 of a combined amplifier-modulator (CAM) 44, which operates as an optical radiation amplifier. Between lenses 38 and 42 is an optical isolator 44, which acts as a substantially one-way path for the radiation from LD 34, so that there is substantially no radiation reflected back into LD 34. As is known in the art, reflected radiation to LD 34 may degrade the performance of the laser diode by, inter alia, reduce laser stability, increase line-width of the output, and increase the chirp. Isolator 40 may be any isolator known in the art, such as a combination of a Faraday 45° rotator and a $$\frac{1}{2}\lambda$$

wave plate. Isolator 40 and lenses 38 and 40 are mounted on substrate 32.

CAM 44 is a generally box-shaped monolithic unit comprising a waveguide 58 running from front facet 45 to a back facet 47 of the CAM. Most preferably, waveguide 58 is implemented to intersect non-normally with the front and back facets of CAM 44, in order to reduce reflections into the CAM, and an intersection 49 of the waveguide with front facet 45 acts as an input port to the CAM. A first semiconductor optical amplifier (SOA) 51, an electro-absorption modulator (EAM) 53, and a second SOA 55, are implemented serially as respective sections of waveguide 58, by methods which are known in the art, such as photolithography and/or chemical etching, for example as described in "Semiconductor Photonic Integrated Circuits" by T. L. Koch et al., in *IEEE J Quantum Electronics* Vol. QE-27 pp 641–653 (1991). A more detailed description of the construction of CAM 44 is given below, with reference to FIG. 6. SOA 51, EAM 53, and SOA 55 are also termed hereinbelow SOA section 51, EAM section 53, and SOA section 55.

Sections 51, 53, and 55 are controlled by respective electrodes 50, 52, and 54. SOAs 51 and 55 operate by having a generally DC current injected at their electrodes. EAM 53 operates by having a signal modulation voltage, typically a rectangular modulation pattern, impressed on its electrode. A DC bias voltage is also impressed on EAM 53, preferably via a bias T filter. Levels of the modulation voltage and bias voltage are most preferably set so that an extinction ratio of modulated radiation output from EAM 53 is as high as possible consistent with acceptable chirp and output power levels.

Figure 3:
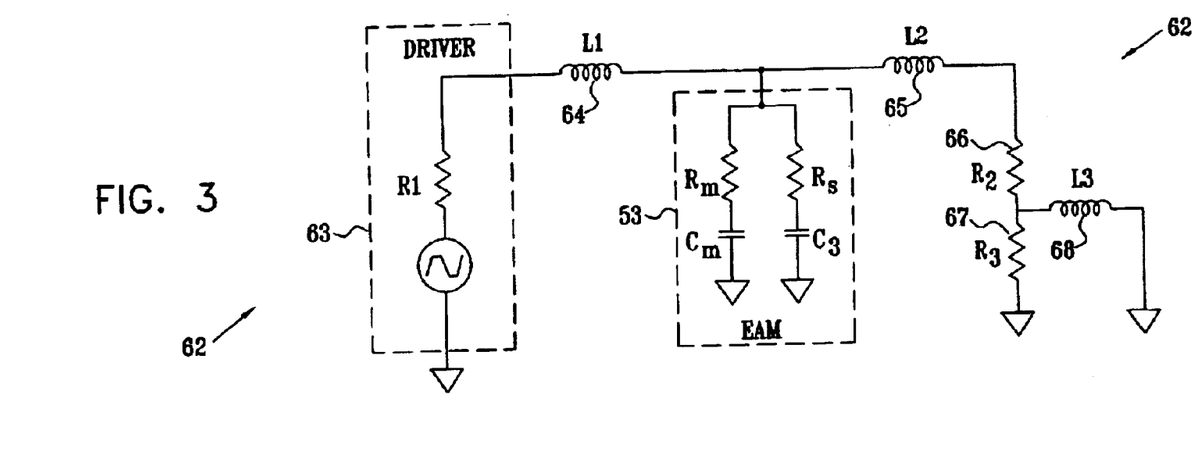
FIG. 3 is a schematic equivalent circuit of a matching circuit used to power an electro-absorption modulator in the module of FIG. 1, according to a preferred embodiment of the present invention.

FIG. 3 is a schematic equivalent circuit of a matching circuit 62 used to power EAM 53, according to a preferred embodiment of the present invention. EAM 53 is assumed to have an equivalent circuit comprising a modulator internal resistance $R_m$ and capacitance $C_m$, and a modulator shunt resistance $R_s$ and capacitance $C_s$. $R_m$ and $C_m$ are in series and have approximate values of 6Ω and 0.4 pF. $R_s$ and $C_s$ are in series and have approximate values of 300Ω and 0.6 pF. An external driver 63, preferably having an equivalent output impedance R1 approximately equal to 50Ω generates the rectangular modulation voltage that is applied to EAM 53.

Matching circuit 62 comprises inductors L1, L2, and L3 and resistances R2 and R3, also termed elements 64, 65, 68, 66, and 67. The matching circuit couples the voltage generated by driver 63 to EAM 53, by matching the impedance of the driver to the effective impedance of the EAM. Typical values for the elements of matching circuit 62 are given in Table I below.

TABLE I

| Element | Typical Value |
| --- | --- |
| L1 | 0.6 nH |
| L2 | 1 nH |
| L3 | 1 nH |
| R2 | 50 Ω |
| R3 | 50 Ω |

Inductors L1, L2, and L3 are most preferably implemented from bond wire attached, as applicable, between driver 63, electrode 52 of EAM 53, R2, R3, and ground. Alternatively, the inductors may be implemented by any other method known in the art. Resistances R2 and R3 may be implemented by any method known in the art. It will be appreciated that the values shown in Table 1 apply for the values of $R_m$, $C_m$, $R_s$, and $C_s$ given above. Those skilled in the art will be able to derive values for the elements of Table I for different values of $R_m$, $C_m$, $R_s$, and $C_s$.

At low frequencies, L1, L2, and L3 act substantially as short circuits, so that R3 is effectively bypassed to ground. As the frequency increases, L3 increases in impedance, so that R3 is no longer bypassed, and so that the voltage applied to EAM 53 from driver 63 increases. Thus the frequency response of EAM is effectively enhanced at high frequencies, so that as the modulation frequency from driver 63 increases, the extinction ratio increases. In contrast to prior art circuits that use relatively bulky capacitors, preferred embodiments of the present invention do not use capacitors and the circuit is consequently smaller and simpler to implement. Furthermore, because of the partially saturated state in which second SOA section 55 is preferably operated, as described below, the frequency enhancement that circuit 62 needs to provide EAM 53 is small, especially compared to frequency adjustments for prior art systems that do not use a partially saturated SOA, and where such an operating state may be considered a disadvantage.

It will be appreciated that matching circuit 62 is shown by way of example, and those skilled in the art will be able to provide similar matching circuits for EAM 53, or for generally similar EAMs, that give substantially similar characteristics to circuit 62. All such matching circuits are assumed to be comprised within the scope of the present invention.

Returning to FIGS. 1 and 2, second SOA section 55 is most preferably operated in a partially saturated state, preferably at approximately 1 dB of saturation, by adjusting the current injected at electrode 54, as is described in more detail below with reference to FIG. 8. Operating SOA section 55 in a partially saturated state significantly improves the performance of module 30 by:

reducing overall chirp of the module; and maintaining the frequency response of the module flat without having to reduce the extinction ratio of EAM section 53 at lower frequencies, and without having to reduce launch power from laser diode 34.

Furthermore, operation of second SOA section 55 in a partially saturated state makes it possible to use the simple matching circuit of FIG. 3 with minimal frequency compensation for EAM section 53, while still resulting in a very flat frequency response.

CAM 44 comprises a power monitor 56, most preferably a power detector which is integrated monolithically in CAM 44, and which measures the radiation leaking from waveguide 58 due to a curvature of the waveguide. Such a power monitor is described in U.S. patent application Ser. No. 09/767,203, which is assigned to the assignee of the present invention and which is incorporated herein by reference. Alternatively, monitor 56 may comprise any other radiation detector known in the art, such as a hybrid detector that is coupled by external optics to the output of CAM 44. Monitor 56 measures the level of the output radiation from CAM 44. The output radiation of CAM 44 is focussed by an output lens 46, which acts as an output port of module 30, onto a receiving fiber optic 48.

Module 30 is preferably mounted on a thermoelectric cooler (TEC) 60, and the module and the TEC are most preferably mounted on an optical bench 61. TEC 60 is used to stabilize an operating temperature of module 30, as is described in more detail below in reference to FIG. 5. Optical bench 61 enables module 30 to be optically aligned with fiber optic 48, so that radiation transfers efficiently into the fiber optic.

Figure 4:
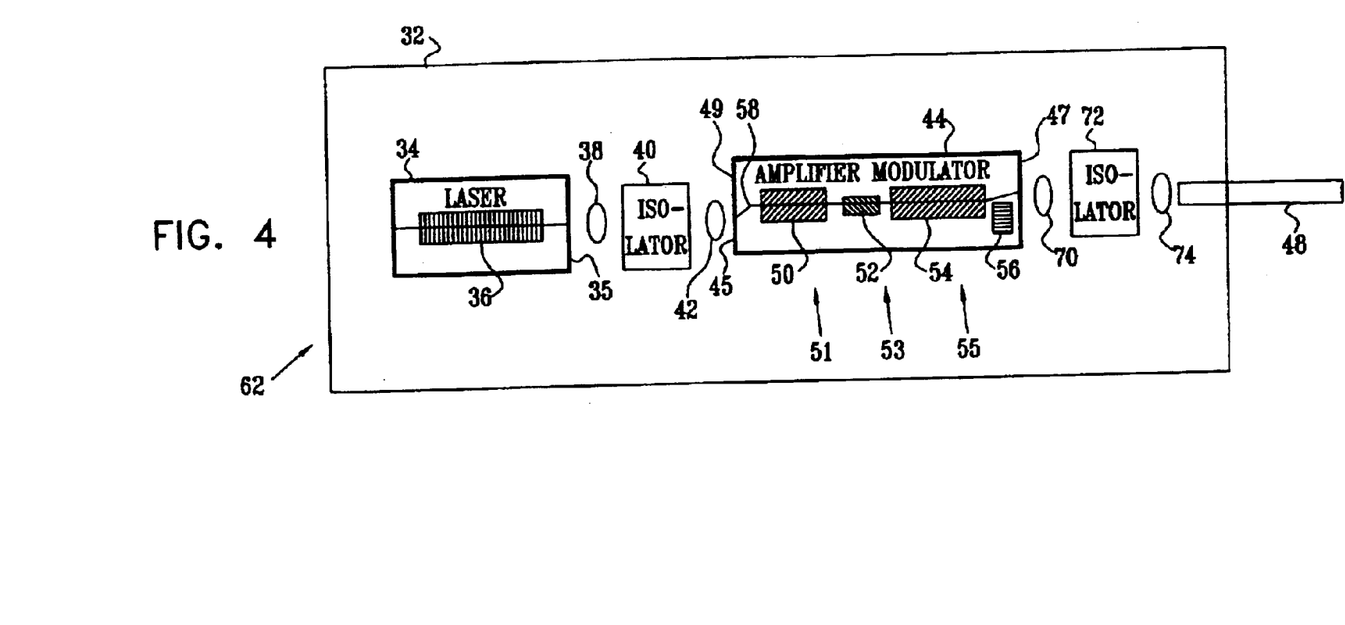
FIG. 4 is a schematic top view of an alternative hybrid transmitter module, according to a preferred embodiment of the present invention.

FIG. 4 is a schematic top view of an alternative hybrid transmitter module 69, according to a preferred embodiment of the present invention. Apart from the differences described below, the operation of module 69 is generally similar to that of module 30, so that elements in modules 30 and 69 with the same identifying numerals are substantially identical in implementation and operation. At the output of CAM 44, lenses 70 and 74, separated by a second isolator 72, replace output lens 46, lens 74 acting as an output port of module 69. Isolator 72, which may be implemented as described above for isolator 40, minimizes optical return loss (ORL) from SOA 55 which may introduce disturbances into a network coupled to fiber optic 48.

Figure 5:
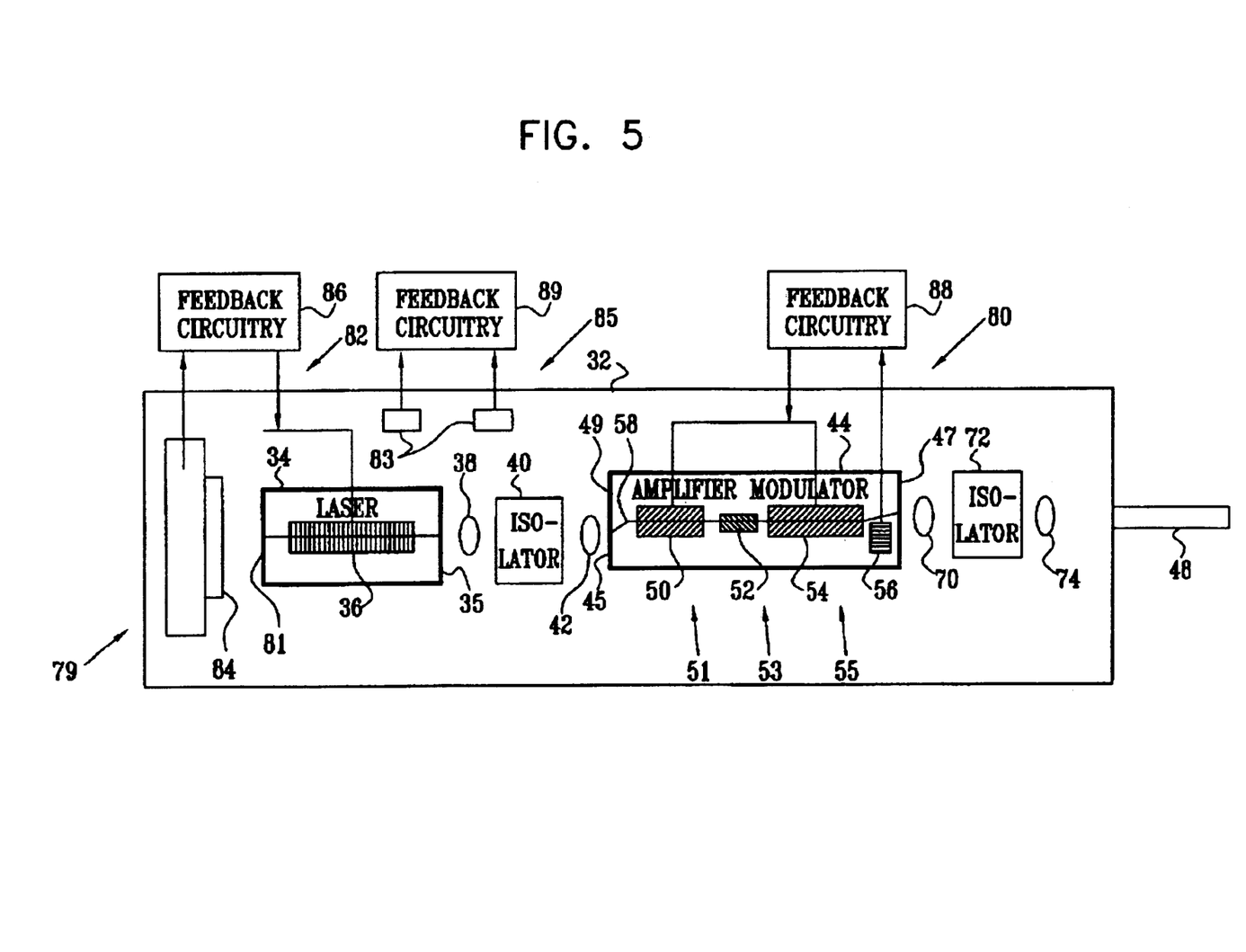
FIG. 5 is a schematic top view of another alternative hybrid transmitter module, according to a preferred embodiment of the present invention.

FIG. 5 is a schematic top view of another alternative hybrid transmitter module 79, according to a preferred embodiment of the present invention. Apart from the differences described below, the operation of module 79 is generally similar to that of module 69, so that elements in modules 69 and 79 with the same identifying numerals are substantially identical in implementation and operation. Module 79 comprises one or more feedback loops which are used to stabilize the output of elements of the module. The different feedback loops are described hereinbelow.

A first feedback loop 82 is a current stabilization loop that is used to stabilize laser 34. Radiation from a back facet 81 of laser 34 is monitored by a radiation detector 84, and the output of the detector is used by first feedback loop circuitry 86 in loop 82 to control current injected into laser 34 via electrode 36. First feedback loop 82 is most preferably used to maintain the power output from laser 34 substantially constant.

A second feedback loop 80 is a current stabilization loop that is used to stabilize SOA 51 and 55. A level from monitor 56 is used by second feedback loop circuitry 88 in loop 80 to control current injected into SOA 51 and 55 via their respective control electrodes 50 and 54. Second feedback loop 80 is most preferably used to maintain the power output from CAM 44 substantially constant. Loop 80 and/or loop 82 may be implemented and used to maintain the output of module 79 substantially constant, so as to counteract the effects of aging on laser 34 and elements of CAM 44.

A third feedback loop 85 is a thermal stabilization loop which is used to control an operating temperature of module 79. Module 79 comprises one or more temperature sensing elements 83, such as thermistors, which are used as input sensors in loop 85. Loop 85 comprises third feedback loop circuitry 89, which controls the thermal transfer, either heat removal from module 79 or heating provided to the module, generated by TEC 60.

Preferably, at least a portion of circuitry 80, 82, or 89 is implemented monolithically in module 79. Alternatively or additionally, circuitry 80, 82, and/or 89 comprise elements which are implemented separately from module 79 and that are optionally integrated as hybrid elements into module 79.

Figure 6:
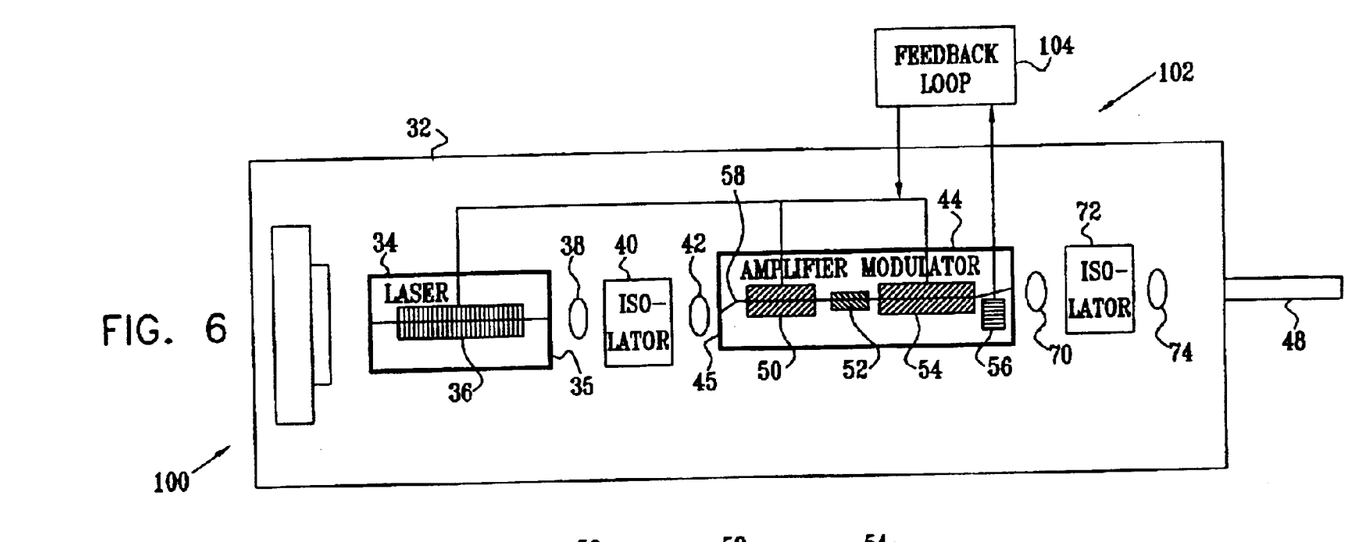
FIG. 6 is a schematic top view of yet another alternative hybrid transmitter module, according to a preferred embodiment of the present invention.

FIG. 6 is a schematic top view of an alternative hybrid transmitter module 100, according to a preferred embodiment of the present invention. Apart from the differences described below, the operation of module 100 is generally similar to that of module 79, so that elements in modules 79 and 100 with the same identifying numerals are substantially identical in implementation and operation. Instead of two feedback loops 80 and 82, module 100 comprises a single electronic feedback loop 102, which receives its input from monitor 56. Feedback circuitry 104 in loop 102 uses the input from monitor 56 to control current injected in parallel into laser 34, SOA 51, and SOA 55. Ratios of current injected into laser 34 and the SOAs may be preset using resistors comprised in circuitry 104.

Most preferably, current to laser 34 is adjusted to be relatively low, so that the laser does not experience a significant loss of power over time. Over relatively long time periods, circuitry 104 maintains the output of module substantially constant by increasing the total current to laser 34 and SOA 51 and SOA 55. In some preferred embodiments of the present invention, loop 102 is connected only to SOA 51 or SOA 55. In this case, current to laser 34 is maintained substantially constant, and the current to the SOA that is in loop 102 is adjusted to compensate for changes in power output from the module.

Figure 7:
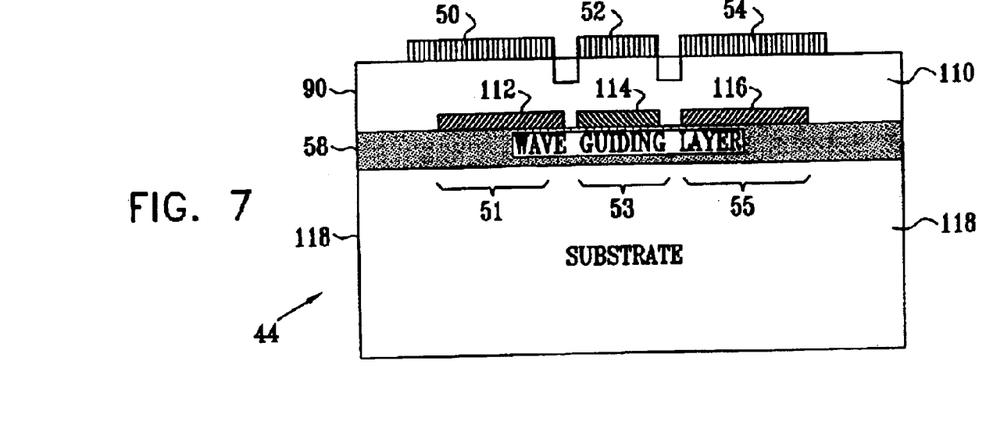
FIG. 7 is a schematic sectional view of a combined amplifier-modulator, according to a preferred embodiment of the present invention.

FIG. 7 is a schematic sectional view of CAM 44, showing detail of SOA sections 51 and 55, and EAM section 53, according to a preferred embodiment of the present invention. CAM 44 is implemented on a substantially inert semiconductor substrate 118, which acts as a common ground for current injected into CAM 44 via electrodes 50, 52, and 54. Written into substrate 118 is a wave-guiding layer 58, and above the wave-guiding layer are written active semiconductor layers 112, 114 and 116, which respectively generate SOA section 51, EAM section 53, and SOA section 55 when current is injected into their respective contact electrodes 50, 52, and 54. Layers 112, 114, and 116 are located below a cladding layer 110 which has different doping than substrate layer 118. For example, substrate layer 118 may be doped n-type while cladding layer 110 may be doped p-type, thus forming p-n junctions at layers 112, 114, and 116, which are the active layers of the SOAs and the EAM. These p-n junctions are biased respectively by their corresponding electrodes 50, 52 and 54. Typically, the SOA's electrodes are biased with a forward bias voltage so that current is injected to the active layers. In the case of EAM section 51, typically this section is biased with a reverse voltage so that a vertical electric field is created at the corresponding p-n junction, causing the electro-absorption effect of the device.

Figure 8:
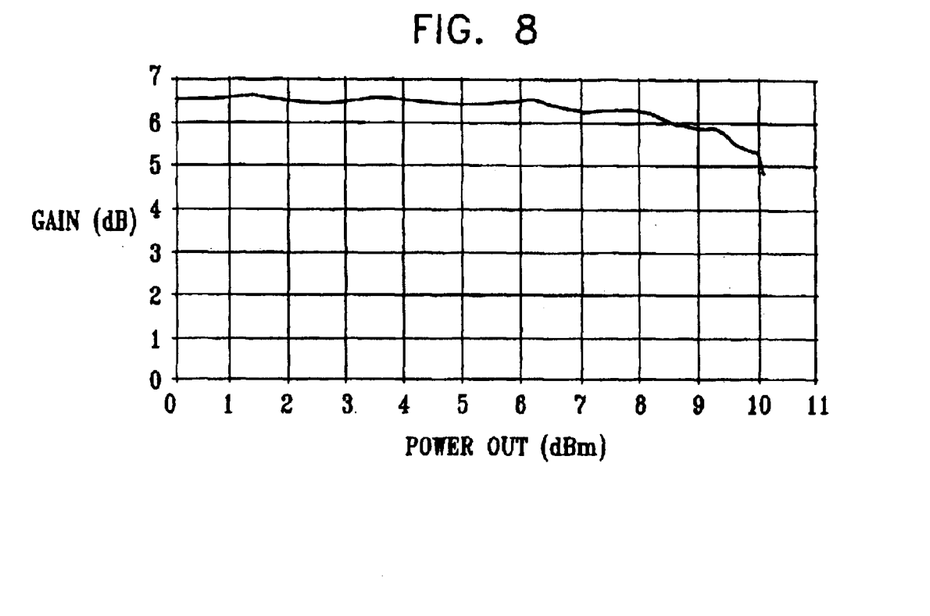
FIG. 8 is a schematic graph of the gain vs. peak power output for the module of FIG. 1, according to a preferred embodiment of the present invention.

FIG. 8 is a schematic graph of the gain vs. peak power output for module 30, according to a preferred embodiment of the present invention. The results shown by the graph are when SOA section 55 operates with approximately 130 mA of injected current at electrode 54, so that the SOA operates in a partially saturated state. As is illustrated by the graph, the output gain from SOA section 55 is approximately constant at 6.5 dB, for output powers from 0 to approximately 8 dBm, and 1 dB partial saturation of the SOA section occurs at approximately 9.5 dBm output power. Similar results to those shown in the graph apply for modules 69, 79, and 100.

Figure 9:
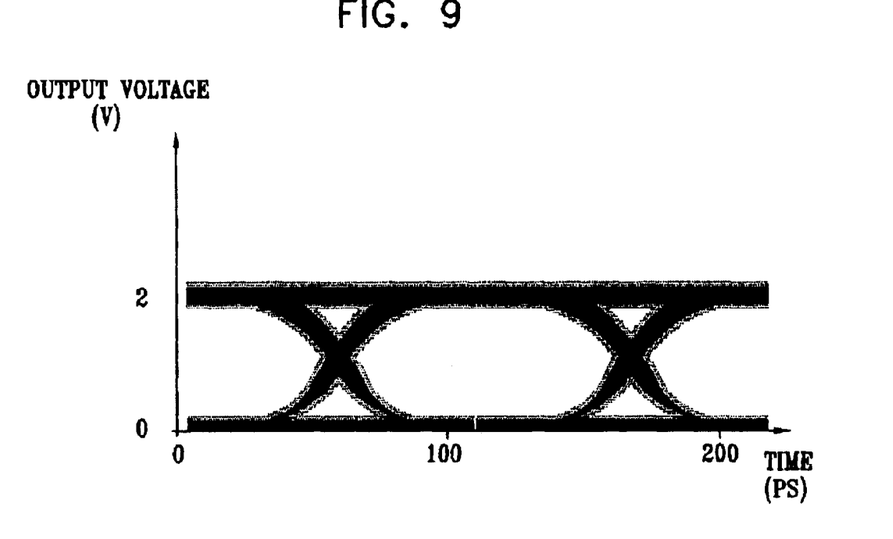
FIG. 9 is a schematic "eye" diagram of the output of the module of FIG. 1, according to a preferred embodiment of the present invention.

FIG. 9 is a schematic "eye" diagram of the output of module 30, according to a preferred embodiment of the present invention. The "openness" of the eye and the narrow "top rail" are indicative of a large signal to noise ratio (>15), as well as a flat frequency response function, for the overall response of the module. It will be appreciated from inspection of FIGS. 8, and 9, and from the above description, that operating SOA 55 at a partial saturation of approximately 1 dB enables matching circuit 62 (FIG. 3) to be operated with substantially less restriction on the extinction ratio of EAM 53 than prior art systems. The high frequency components of the signal are enhanced by the partially saturated SOA, so that more gain is applied to isolated "one" bits and/or to the leading edge of "one" bits in the bit stream. The combination of EAM 53 followed by SOA 55 thus acts as an efficient modulator and amplifier of radiation with a relatively flat and broadband frequency response behavior over the required range.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. An optical radiation amplifier, comprising:
an input port which receives the optical radiation;
a first semiconductor optical amplifier (SOA), which is coupled to receive the optical radiation from the input port and is adapted to amplify the optical radiation to produce amplified optical radiation in response to a first current injected into the first SOA;
an electro-absorption modulator (EAM), which is coupled to receive the amplified optical radiation and is adapted to modulate the amplified optical radiation in response to a modulation voltage applied to the EAM so as to produce modulated radiation; and
a second SOA, which is coupled to receive the modulated radiation and is adapted to amplify the modulated radiation in response to a second current injected into the second SOA.

2. An amplifier according to claim 1, and comprising a waveguide, wherein the first SOA, the EAM, and the second SOA are formed as respective sections of the waveguide.

3. An amplifier according to claim 2, and comprising a substrate wherein the first SOA, the EAM, the second SOA, and the waveguide are formed as a monolithic unit.

4. An amplifier according to claim 3, wherein the monolithic unit comprises a power monitor which is adapted to measure a level of radiation output from the second SOA.

5. An amplifier according to claim 3, wherein the monolithic unit comprises a front facet and a back facet which are intersected respectively by the waveguide at a first and a second intersection, wherein the input port comprises the first intersection, and wherein at least one of the intersections is non-normal to its respective facet.

6. An amplifier according to claim 1, wherein the second current operates the second SOA in a partially saturated state.

7. An amplifier according to claim 6, wherein the partially saturated state comprises a partial saturation of approximately 1 dB.

8. An amplifier according to claim 7, and comprising an impedance matching circuit connected to the EAM so that a frequency response of the amplifier is substantially flat.

9. An amplifier according to claim 8, wherein the impedance matching circuit is non-capacitive.

10. An optical transmitter, comprising:
a substrate;
a semiconductor laser which is adapted to output coherent radiation;
an isolator which is coupled to receive the coherent radiation and to transport the received radiation in a preferred direction while inhibiting transmission of the radiation in a direction opposite the preferred direction;
a semiconductor optical amplifier (SOA) which is coupled to receive the coherent radiation from the isolator and is adapted to amplify the coherent radiation so as to generate amplified radiation; and
an electro-absorption modulator (EAM), which is coupled to receive the amplified radiation and is adapted to modulate the amplified radiation in response to a modulation voltage applied to the EAM so as to produce modulated radiation,
wherein the semiconductor laser, the isolator, the SOA, and the EAM are mounted on the substrate as a single hybrid integrated module that emits the modulated radiation.

11. A transmitter according to claim 10, and comprising a subsequent SOA which is coupled to receive the modulated radiation from the EAM and is adapted to amplify the modulated radiation so as to generate modulated amplified radiation, wherein the subsequent SOA is mounted on the substrate, and wherein the single hybrid integrated module comprises the subsequent SOA.

12. A transmitter according to claim 11, and comprising
an output port; and
a subsequent isolator which is coupled to receive the modulated amplified radiation and which is adapted to transport the modulated amplified radiation to the output port while inhibiting reflection of radiation from the output port.

13. A transmitter according to claim 11, and comprising a power monitor which is adapted to measure a level of the modulated amplified radiation, wherein the single hybrid integrated module comprises the power monitor, and wherein an output of the power monitor is an input to a feedback loop controlling current injected into the SOA and the subsequent SOA.

14. A transmitter according to claim 13, and wherein the current is injected into the semiconductor laser.

15. A transmitter according to claim 10, wherein the semiconductor laser comprises a back facet through which a portion of the coherent radiation is output, and comprising a radiation detector which is adapted to monitor the portion of the coherent radiation, wherein the single hybrid integrated module comprises the radiation detector, and wherein an output of the detector is an input to a feedback loop controlling current injected into the semiconductor laser.

16. A transmitter according to claim 10, wherein the single hybrid integrated module comprises at least one temperature sensor that provides an input to feedback circuitry, wherein the feedback circuitry controls thermal transfer to and from the module in response to the input.

17. An optical radiation amplifier, comprising:
an electro-absorption modulator (EAM), which is coupled to receive the optical radiation and is adapted to modulate the optical radiation in response to a modulation voltage applied to the EAM so as to produce modulated radiation; and
a semiconductor optical amplifier (SOA), which is coupled to receive the modulated radiation and is adapted to amplify the modulated radiation in response to a current injected into the SOA, wherein the current operates the SOA at a partial saturation of approximately 1 dB.

18. An optical radiation amplifier according to claim 17, and comprising an impedance matching circuit connected to the EAM so that a frequency response of the optical radiation amplifier is substantially flat.

19. An optical radiation amplifier according to claim 18, wherein the impedance matching circuit is non-capacitive.

20. A method for amplifying optical radiation, comprising:

receiving the optical radiation in a first semiconductor optical amplifier (SOA);

amplifying the optical radiation in the first SOA to produce amplified optical radiation in response to a first current injected into the first SOA;

receiving the amplified optical radiation in an electro-absorption modulator (EAM);

modulating the amplified optical radiation in the EAM in response to a modulation voltage applied to the EAM so as to produce modulated radiation;

receiving the modulated radiation in a second SOA; and amplifying the modulated radiation in the second SOA in response to a second current injected into the second SOA.

21. A method according to claim 20, and comprising forming the first SOA, the EAM, and the second SOA as respective sections of a waveguide.

22. A method according to claim 21, and comprising forming the first SOA, the EAM, the second SOA, and the waveguide on a substrate as a monolithic unit.

23. A method according to claim 22, wherein the monolithic unit comprises a power monitor which is adapted to measure a level of radiation output from the second SOA.

24. A method according to claim 22, wherein the monolithic unit comprises a front facet and a back facet which are intersected respectively by the waveguide at a first and a second intersection, and wherein at least one of the intersections is non-normal to its respective facet.

25. A method according to claim 20, wherein the second current operates the second SOA in a partially saturated state.

26. A method according to claim 25, wherein the partially saturated state comprises a partial saturation of approximately 1 dB.

27. An method according to claim 26, and comprising connecting an impedance matching circuit to the EAM so that a frequency response of the amplifier is substantially flat.

28. A method according to claim 27, wherein the impedance matching circuit is non-capacitive.

29. A method for transmitting radiation, comprising:

outputting coherent radiation from a semiconductor laser;

receiving the coherent radiation in an isolator which transports the received radiation in a preferred direction while inhibiting transmission of the radiation in a direction opposite the preferred direction;

receiving the coherent radiation from the isolator in a semiconductor optical amplifier (SOA), and amplifying the coherent radiation in the SOA so as to generate amplified radiation;

receiving the amplified radiation in an electro-absorption modulator (EAM), and modulating the amplified radiation in the EAM in response to a modulation voltage applied to the EAM so as to produce modulated radiation; and mounting the semiconductor laser, the isolator, the SOA, and the EAM on a substrate as a single hybrid integrated module that emits the modulated radiation.

30. A method according to claim 29, and comprising:

receiving the modulated radiation from the EAM in a subsequent SOA;

amplifying the modulated radiation in the subsequent SOA so as to generate modulated amplified radiation; and mounting the subsequent SOA on the substrate so that the single hybrid integrated module comprises the subsequent SOA.

31. A method according to claim 29, and comprising:

receiving the modulated amplified radiation in a subsequent isolator; and transporting the modulated amplified radiation to an output port of the module while inhibiting reflection of radiation from the output port in the subsequent isolator.

32. A method according to claim 29, wherein the single hybrid integrated module comprises a power monitor which is adapted to measure a level of the modulated amplified radiation, and wherein an output of the power monitor is an input to a feedback loop controlling current injected into the SOA and the subsequent SOA.

33. A method according to claim 32, and wherein the current is injected into the semiconductor laser.

34. A method according to claim 29, wherein the semiconductor laser comprises a back facet through which a portion of the coherent radiation is output, wherein the single hybrid integrated module comprises a radiation detector which is adapted to monitor the portion of the coherent radiation, and wherein an output of the detector is an input to a feedback loop controlling current injected into the semiconductor laser.

35. A method according to claim 29, wherein the single hybrid integrated module comprises at least one temperature sensor that provides an input to feedback circuitry, wherein the feedback circuitry controls thermal transfer to and from the module in response to the input.

36. A method for amplifying optical radiation, comprising:

receiving the optical radiation in an electro-absorption modulator (EAM), which is adapted to modulate the optical radiation in response to a modulation voltage applied to the EAM so as to produce modulated radiation;

receiving the modulated radiation in a semiconductor optical amplifier (SOA), which is adapted to amplify the modulated radiation in response to a current injected into the SOA; and injecting the current into the SOA so as to operate the SOA at a partial saturation of approximately 1 dB.

37. A method according to claim 36, and comprising connecting an impedance matching circuit to the EAM so that a frequency response of the amplifier is substantially flat.

38. A method according to claim 37, wherein the impedance matching circuit is non-capacitive.

* * * * *